United States Patent [19]

Ogura et al.

[11] Patent Number: 4,992,389
[45] Date of Patent: Feb. 12, 1991

[54] MAKING A SELF ALIGNED SEMICONDUCTOR DEVICE

[75] Inventors: Mitsugi Ogura, Yokohama; Shioji Ariizumi; Fumio Horiguchi, both of Tokyo; Fujio Masuoka, Yokohama, all of Japan

[73] Assignee: Kabushiki Kaisha Toshiba, Kawasaki, Japan

[21] Appl. No.: 142,272

[22] Filed: Jan. 4, 1988

Related U.S. Application Data

[63] Continuation of Ser. No. 824,575, Jan. 23, 1986, abandoned.

[30] Foreign Application Priority Data

Feb. 8, 1985 [JP] Japan .................. 60-22941
Feb. 8, 1985 [JP] Japan .................. 60-22942
Feb. 8, 1985 [JP] Japan .................. 60-22943

[51] Int. Cl.⁵ .................................... H01L 21/265
[52] U.S. Cl. ......................................... 437/41; 437/43; 437/44; 437/56; 148/DIG. 141
[58] Field of Search .............. 437/41, 42, 43, 44, 437/45, 46, 191, 193, 186, 162, 233, 238

[56] References Cited

U.S. PATENT DOCUMENTS

| | | | |
|---|---|---|---|
| 4,330,931 | 5/1982 | Liu | 29/571 |
| 4,342,149 | 8/1982 | Jacobs et al. | 29/576 B |
| 4,356,623 | 11/1982 | Hunter | 29/576 B |
| 4,366,613 | 1/1983 | Ogura et al. | 29/571 |
| 4,376,947 | 3/1983 | Chiu et al. | 29/576 B |
| 4,382,827 | 5/1983 | Romano-Moran et al. | 29/576 B |
| 4,407,733 | 9/1983 | Sasaki . | |
| 4,419,809 | 12/1983 | Riseman et al. | 29/576 B |
| 4,419,810 | 12/1983 | Riseman | 29/576 B |
| 4,513,494 | 4/1985 | Batra . | |
| 4,616,399 | 10/1986 | Ooka | 29/576 B |
| 4,616,401 | 10/1986 | Takeuchi | 29/576 B |

FOREIGN PATENT DOCUMENTS 2509315 9/1975 Fed. Rep. of Germany ..... 357/23.9
55-52262 4/1980 Japan .................. 357/23.9
56-21372 2/1981 Japan .................. 357/23.9
56-26470 3/1981 Japan .................. 357/23.9
56-130970 10/1981 Japan .................. 357/23.9

OTHER PUBLICATIONS

Tsang, P. J. et al, "Fabrication of High-Performance LDD FETs . . . Technology", IEEE Journal of Solid-State Circuits, vol. SC-17, No. 2, Apr. 1982, pp. 220–226.

Ghandhi, "VLSI Fabrication Principles", 1983, pp. 584–587, 594–595, 604–605.

IBM Technical Disclosure Bulletin (vol. 27, No. 23, Aug. 1984), Hsieh, "Deep Double-Implanted LDD for Reducing Substrate Current".

"A Limitation of Channel Length in Dynamic Methorics", Nishizawa et al, IEEE Transactions on Electron Devices, vol. ED-27, No. 8, Aug. 1980.

Primary Examiner—Brian E. Hearn
Attorney, Agent, or Firm—Oblon, Spivak, McClelland, Maier & Neustadt

[57] ABSTRACT

A method of producing a semiconductor device of high integration density and high reliability with high yield, using self-alignment techniques, including forming a gate electrode on a semiconductor substrate of a first conductivity type with an insulating film arranged above and below it, forming a pair of first impurity regions of a second conductivity type mutually separated and self-aligned with the gate electrode in the substrate, and forming a wall consisting of insulator on at least one side face of the gate electrode and the upper and lower insulating films, forming a second highly doped impurity region of second conductivity type at greater depth in the substrate than the first impurity region in a self-aligned manner with respect to the wall, forming an electrode layer connected to the second impurity region, with at least a portion of the electrode extending over the upper insulating film of the gate electrode, and selectively forming a wiring layer on the electrode layer.

1 Claim, 11 Drawing Sheets

FIG. 14a
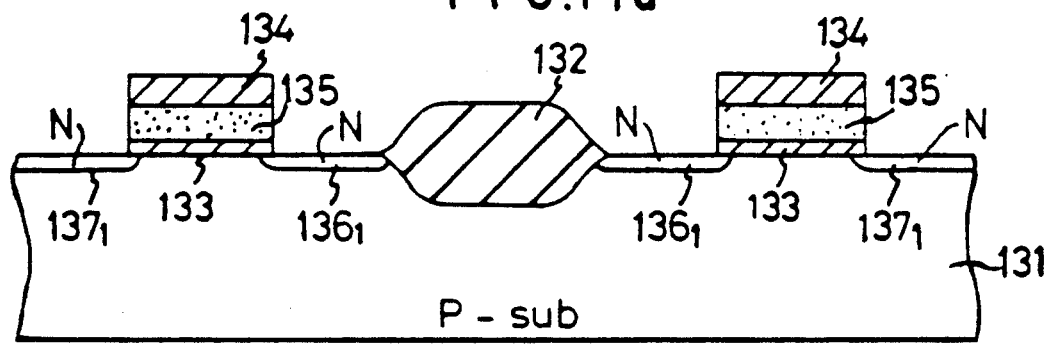
FIG. 14b
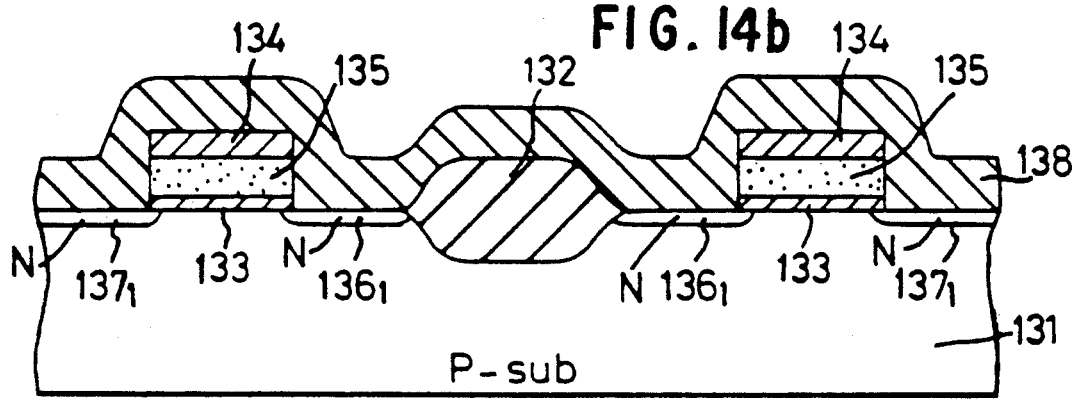
FIG. 14c
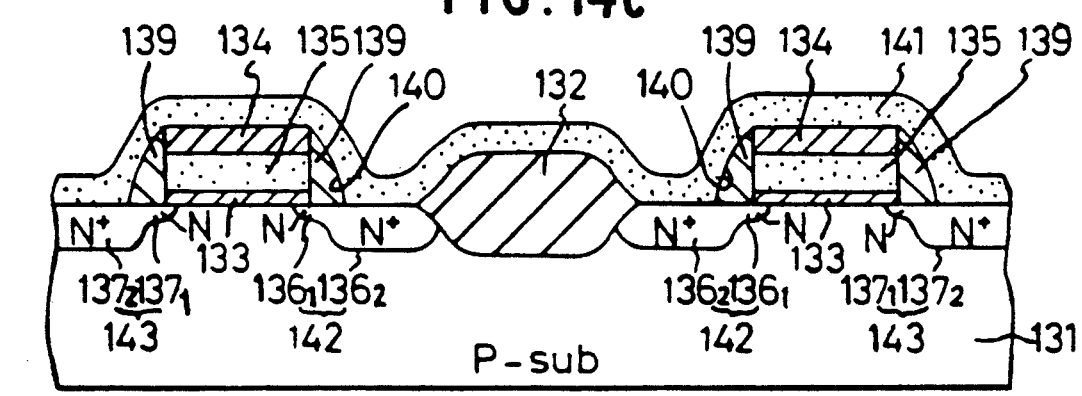
FIG. 14d

MAKING A SELF ALIGNED SEMICONDUCTOR DEVICE

This application is a continuation of application Ser. No. 824,575, filed on Jan. 23, 1986, now abandoned.

BACKGROUND OF THE INVENTION (1) Field of the Invention

This invention is concerned with a semiconductor device and a method of manufacturing it, and in particular relates to a semiconductor device and a method of manufacturing it wherein a diffusion regions at a surface of the semiconductor substrate and an electrode layer made of polycrystalline silicon are self-aligned. And this invention further, relates to the construction of a memory element and a method of manufacturing it. Such memory elements are utilized both in semiconductor memory devices and in CPUs etc. which incorporate a semiconductor memory. The invention relates in particular to the construction of a memory element for a read-only memory (ROM) and to a method of manufacturing it.

(2) Description of the Prior Art

Recent years have seen rapid progress in semiconductor technology. In the future, it will become necessary to work at even greater precision and to reduce the alignment tolerance between different layers, in order to increase the level of circuit integration. The preferred strategy for improving the alignment tolerance, i,e, reducing it, is self-alignment between the layers. In particular, self-alignment of contacts and/or direct contacts is important for increasing the level of circuit integration. However, the present situation is that there is no fully established technique for self-alignment of direct contacts between polycrystalline silicon and diffusion regions.

Semiconductor devices such as redundant n-channel MOSICs wherein the polycrystalline silicon has direct contact with the diffusion regions, have conventionally been manufactured by the method described below with reference to FIG. 1(a) to (e).

First of all, as shown in FIG. 1(a), a p type silicon substrate 1 is selectively oxidized to form a field oxide layer 2 and island-shaped oxide films, isolated by field oxide layer 2, are formed on the surface of substrate 1 by thermal oxidization. A first polycrystalline silicon layer is then formed over the entire surface. Next, this polycrystalline silicon layer is doped with an impurity such as phosphorus, then gate electrode 3 is formed by patterning the polycrystalline silicon layer. Gate oxide film 4 is then formed by selectively etching the oxide film, using this gate electrode 3 as a mask, n type diffusion regions $5_1$, $6_1$ are then formed by doping the surface of substrate 1 with an n type impurity such as phosphorus, using gate electrode 3 as a mask.

Next, as shown in FIG. 1(b), a CVD-SiO$_2$ film 7 is deposited over the entire surface, and a resist pattern 8 is formed on this CVD-SiO$_2$ film 7 by photolithography. After this, direct contact holes 9 are formed by selectively etching the CVD-SiO$_2$ film 7, using the resist pattern 8 as a mask, as shown in FIG. 1(c).

Next, a second polycrystalline silicon later 10 is deposited over the whole surface. Phosphorus is then thermally diffused into this second polycrystalline silicon layer 10 under for example a POCl$_3$ atmosphere, and passes through this polycrystalline silicon layer 10 to form highly doped n$^+$ type diffusion regions $5_2$ and $6_2$ in n type diffusion regions $5_1$ and $6_1$ and situated at greater depth than said n type diffusion regions $5_1$ and $6_1$. In this way, drain region 11 consisting of n type diffusion region $5_1$ and n$^+$ type diffusion region $5_2$ and source region 12 consisting of n type diffusion region $6_1$ and n$^+$ type diffusion region $6_2$ are respectively formed, as shown in FIG. 1(d). The MOSIC is then completed by patterning second polycrystalline silicon layer 10 to form electrode layer 13 connected through direct contact holes 9 to drain region 11 and source region 12 respectively, as shown in FIG. 1(e).

However, since direct contact holes 9 are formed using resist pattern 8 (formed by photolithography) as a mask, in the above-described method shown in manufacture of FIG. 1, a mask alignment tolerance has to be provided. Consequently, an alignment tolerance is needed between gate electrode 3 and field oxide layer 2. This presents an obstacle to increasing the level of circuit integration.

A method of manufacturing a semiconductor device has recently been announced in IEDM, whereby direct contact can be achieved in a self-aligned manner. This method will now be described with reference to FIG. 2 (a) to (e).

First of all, as shown in FIG. 2(a), a field oxide layer 22 is formed by selective oxidation of p type silicon substrate 21 and islands of oxide film isolated by field oxide layer 22 are formed on the surface of substrate 21 by thermal oxidation. A first polycrystalline silicon layer is then formed over the entire surface. After this, the polycrystalline silicon layer is doped with impurity such as phosphorus, then gate electrode is formed by patterning the polycrystalline silicon layer. Gate oxide film 24 is then formed by selective etching of the oxide film using gate electrode 23 as a mask. N type diffusion regions $25_1$ and $26_1$ are then formed by doping the surface of substrate 21 with an n type impurity, such as phosphorus, using gate electrode 23 as a mask.

Wet oxidation treatment is then performed. In this process, as shown in FIG. 2(b), the polycrystalline silicon is oxidized at a greater rate than the monocrystalline silicon, so a comparatively thick oxide film 27 is formed around the gate electrode 23 consisting of polycrystalline silicon and a comparatively thin oxide film 28 is formed on the exposed surface of monocrystalline silicon substrate 21. Resist pattern 29 is then formed by photolithography on field oxide layer 22.

Direct contact holes 30 are then formed by etching until thin oxide film 28 of the surface of substrate 21 is completely removed. As shown in FIG. 2(c), oxide film 27 remains around gate electrode 23.

Next, resist pattern 29 is removed, and second polycrystalline silicon layer 31 is deposited. Then phosphorus is thermally diffused through polycrystalline silicon layer 31 into second polycrystalline silicon layer 31 under for example a POCl$_3$ atmosphere, so as to form highly doped n$^+$ type diffusion regions $25_2$ and $26_2$ situated at greater depth than n type diffusion regions $25_1$ and $26_1$. In this way, as shown in FIG. 2(d), drain region 32 consisting of n type diffusion region $25_1$ and n$^+$type diffusion region $25_2$ and source region 33 consisting of n type diffusion region $26_1$ and n$^+$ type diffusion region $26_2$ are respectively formed. As shown in FIG. 2(e), the MOSIC is then completed by patterning second polycrystalline silicon layer 31 to form electrode layer 34 connected through direct contact holes 30 to drain region 32 and source region 33, respectively.

With the method of manufacture described above and illustrated in FIG. 2, direct contact holes 30 can be formed in a self-aligned manner with respect to gate electrode 23 and field oxide layer 22. This makes it possible to produce MOSICs of a high degree of intergration. However, with such a method, the angle of gate electrode 23 after wet oxidation treatment is sharp, and the thickness of oxide film 27 around gate electrode 23 becomes very thin because of the etching, so there is a decrease in the breakdown voltage.

Furthermore, the normally used ROMs are also called "mask program ROMs" because the data is written into them in the wafer manufacturing process using a mask. There are three commonly used ways of writing the data into such a ROM. The first way is the contact method. The second is the so-called S (source) D (drain) G (gate) method, in which the data is written by the presence or absence of transistors. The third is a method in which the threshold voltage of the transistors is altered in accordance with the written data. A further distinction may be made based on the circuit configuration of the memory cell, between NOR type ROMs and NAND-NOR type ROMs. Yet a further distinction may be made based on the system in which the ROMs are used, between synchronous ROMs and asynchronous ROMs. NOR type ROMs are suited to high-speed operation and NAND-NOR type ROMs are used for slower speeds.

In the above classification of ROMs based on the circuit configuration of the memory cell, for NOR type ROMs (which are suited to high-speed operation), the contact arrangement is often adopted. This is because this arrangement is effective in meeting production requirements, because, in addition to ease of circuit design and reliablility of data writing, in such ROMs the step of data writing is in the latter half of the total sequence of steps.

FIG. 3 is a plan view of the pattern showing the configuration of the memory cell area of a conventional ROM utilized in this contact method. In the Figure, the region enclosed by a broken line is a single memory cell 301. A plurality of memory cells are arranged in the horizontal direction and in the vertical direction. A single memory cell 301 is constituted by a single MOS transistor. In more detail, memory cell 301 comprises: a drain diffusion region 302; a source diffusion region 303 common to the MOS transistors arranged in the horizontal direction in the drawing; word line 304 constituted by a polycrystalline silicon layer which constitutes the common gate electrode of the MOS transistors arranged in the horizontal direction; and data line 306 made of aluminum and selectively connected through contact hole 305 in accordance with the written date to the drains (diffusion region 302) of the MOS transistors arranged in the vertical direction in the drawing.

FIG. 4 is an equivalent circuit diagram of a ROM having as pattern as shown in FIG. 3. In as contact type ROM, as its name implies, data is written when contacts are formed in the wafer process, so the presence or absence of contact by virtue of contact hole 305 corresponds to data "1" or "0".

In the case of a ROM having a pattern as shown in FIG. 3, diffusion region 302, which constitutes the drain of the memory cell MOS transistor is connected to data line 306 through contact hole 305. Diffusion region 302 is made of silicon while data line 306 is made of a metal such as aluminum. Their work functions are therefore different. To make the contact resistance of materials of different work functions sufficiently small, contact hole 305 has to have a large area. The distance between the periphery of contact hole 305 and the periphery of diffusion region 302 also has to be sufficiently large to prevent short-circuiting with the substrate. Consequently the area occupied by diffusion regions 302 of the respective drains becomes large, so that the area of a single memory cell 301 becomes large. In the case of a ROM of large memory capacity, this results in a large chip area, increasing costs.

The present inventors have already invented the ROM whose pattern is shown in plan view in FIG. 5 and in cross-section in FIG. 6 with the object of eliminating the above-mentioned drawbacks possessed by the conventional ROM. This ROM is described in the specification of Japanese patent application No. Sho. 58-75026 and a resume of this description will now be given. In this ROM, n channel MOS transistors are used as the memory cells. In FIG. 5, the region enclosed by the broken line is a single memory cell 510. A plurality of memory cells are arranged in a matrix configuration in the horizontal and vertical directions. As in FIG. 3 described above, a single memory cell is constituted by a single MOS transistor. N+ type regions 512 constituting the drains of each memory cell 510 are provided in a p type silicon semiconductor substrate 511. N+ region 513 is provided extending in the horizontal direction in substrate 511 and constitutes a common source region of the plurality of memory cells arranged in the horizontal direction in the drawing. Word line 514, consisting of a first polycrystalline silicon layer and constituting the common gate electrode of the plurality of memory cells arranged in the horizontal direction is provided extending so as to cut across horizontally between n+ regions 512 and 513 in the plurality of memory cells arranged in the horizontal direction. The surface of n+ region 512 constituting the drain of each of the memory cells is connected with wiring layer 516 consisting of a second polycrystalline silicon layer, through contact holes 515 formed in each memory cell of two rows arranged in the horizontal direction. The end portion of this wiring layer 516 is arranged so as to extend as far as word line 514 constituting the common gate electrode. Data line 518 made of aluminum and selectively connected (through contact holes 517 provided in accordance with the written data) with n+ region 512 (constituting the drain) is provided in common for the plurality of memory cells arranged in the horizontal direction.

FIG. 6 is a cross-sectional view along the line X—X in FIG. 5 showing the construction of a single memory cell. Numeral 520 designates the field oxide film for element isolation. Numeral 521 designates the oxide film provided below word line 514, and 522 to 524 are respectively oxide films. Inversion prevention region 525 is provided on the surface of substrate 511 below field oxide film 520.

In a ROM constructed as above, instead of the data line 518 (made of aluminum) being directly connected to n+ region 512 (constituting the drain of the memory cell transistors), first of all, wiring layer 516 (made of polycrystalline silicon) is connected through contact hole 515 to part of the surface of n+ region 512, and then in turn this wiring layer 516 is itself connected to data line 518 (made of aluminum) through contact holes 517 that are selectively provided in accordance with the written data. Since both n+ type region 512 and wiring layer 516 are made of silicon, their work functions are equivalent. This makes it possible to make the contact resistance between the two sufficiently small even though the area of contact is restricted, and thereby enables the area of contact holes 515 on n+ type region 512 to be reduced. Also, when n+ type region 512 and wiring layer 516 are connected through contact holes 515, field oxide film 520 can have a self-aligned construction, so that contact holes 515 can maintain a suitable distance with respect to the word line 514 only. The area of n+ type region 512 itself can therefore be made sufficiently small. In terms of memory cell area this enables a reduction of 20 to 50% over that of the FIG. 3 construction described above.

On the other hand, when effecting a connection between data line 518 (made of aluminum) and wiring layer 516 (made of polycrystalline silicon), these two substances having different work functions, wiring layer 516 extends to above word line 514, and its planar distance is made sufficiently longer than n+ type region 512. The area of the contact holes 517, which constitute the region of connection between data line 518 and wiring layer 516, can therefore be made sufficiently great, irrespective of the size of the area of n+ type region 512. This enables high density of circuit integration to be achieved without adverse effects on the voltage and current characteristics of the transistors produced by the magnitude of the contact resistance (which is determined by the area of the contact hole).

Thus, with the ROM shown in FIG. 5, a considerable reduction in cell size can be attained compared with the ROM described above as shown in FIG. 3. However, even with such cells, when the dimensions are scaled down in order to increase memory capacity, as shown in FIG. 6, the margin A which is left in forming of the contact holes (buried contact holes) 515 to allow for possible mis-alignment and the distance B likewise including a margin for mis-alignment, in order to guarantee the requisite area of contact, occupy a large part of the cell. As there are limits to the degree to which it is possible to improve the accuracy of mask alignment, large increases in the density of circuit integration cannot be expected unless this problem is solved.

SUMMARY OF THE INVENTION

An object of this invention is to provide a semiconductor device and a method of manufacturing it whereby semiconductor devices of a high level of circuit integration and high reliability can be manufactured with high yield.

A further object of this invention is to provide a read-only semiconductor device and a method of manufacturing it wherein an electrode layer of polycrystalline silicon constituting a contact pad for a metal wiring layer forming the data lines can form buried contacts of self-aligned configuration, and which is capable of being constructed with very high density of circuit integration.

This invention provides a semiconductor device comprising: a gate electrode provided on a semiconductor substrate of a first conductivity type and with an insulating film arranged above and below it; a pair of first impurity regions of a second conductivity type provided mutually separated and self-aligned with said gate electrode in said substrate; a wall consisting of insulator provided on at least one side face of said gate electrode and said upper and lower insulating films; a second highly doped impurity region of second conductivity type provided in a self-aligned manner with respect to said wall in said substrate; an electrode layer connected to said second impurity region and whereof at least a portion extends over the upper insulating film of said gate electrode; and a wiring layer selectively connected with said electrode layer.

By means of this invention, as mentioned above, semiconductor devices of high degree of integration and high reliability can be manufactured in high yield.

DESCRIPTION OF THE PREFERRED EMBODIMENTS

This invention is explained below with reference to the first embodiment of its application to manufacture of an n channel MOSIC illustrated in FIG. 7 (a) to (f).

Figure 7A:
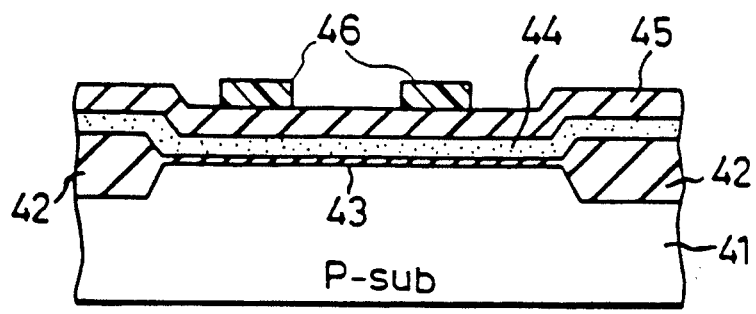
FIG. 7 (a) to (f) are cross-sectional views showing the process of manufacturing an n channel MOSIC according to the first embodiment of this invention.

First of all, as shown in FIG. 7(a), selective oxidation is performed on for example a p type silicon substrate 41 to form a field oxide layer 42. Thermal oxidation is then carried out to form oxide film 43 of thickness for example 200 Angstrom units on the surface of island-shaped regions of substrate 41. These island-shaped regions are isolated by field oxide layer 42. Next first phosphorus-containing polycrystalline silicon layer 44 of thickness 3000 Angstrom units is formed over the whole surface by, for example, CVD (Chemical Vapor Deposition).

The polycrystalline silicon layer may be initially formed without doping with impurity and phosphorus doping performed subsequently. After this, a SiO$_2$ film 45 of thickness 3000 Angstrom units is deposited over the whole face on top of the polycrystalline silicon layer 44. Resist pattern 46 is then formed by photolithography on top of SiO$_2$ film 45 in the areas destined for gate electrode formation. SiO$_2$ film 45 may be formed by thermal oxidation of first polycrystalline silicon layer 44.

Figure 7B:
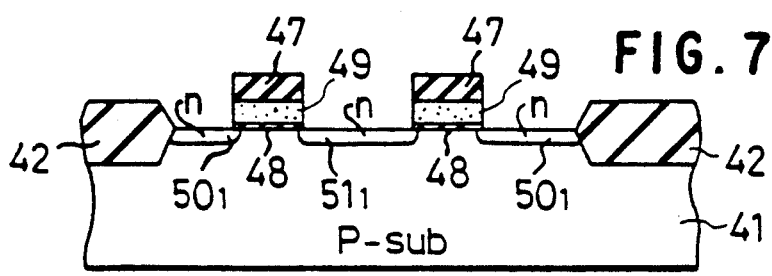

Next, etching is performed on SiO$_2$ film 45, first polycrystalline silicon layer 44 and oxide film 43 by the CDE (Chemical Dry Etching) or RIE (Reactive Ion Etching) method, using resist pattern 46 as a mask, thereby forming gate electrodes 49 consisting of polycrystalline silicon with SiO$_2$ film pattern 47 and gate oxide film 48 arranged above and below them. Thin oxide film 43 may be left in place without being etched. Next, as shown in FIG. 7(b), n type diffusion regions $50_1$ and $51_1$, are formed by removing resist pattern 46 and ion implantation of n type impurities, for example arsenic, in a dose of $10^{12}$ to $10^{14}$ atoms cm$^{-2}$, using as a mask gate electrodes 49 and SiO$_2$ film pattern 47 and gate oxide film 48 above and below them.

Figure 7C:
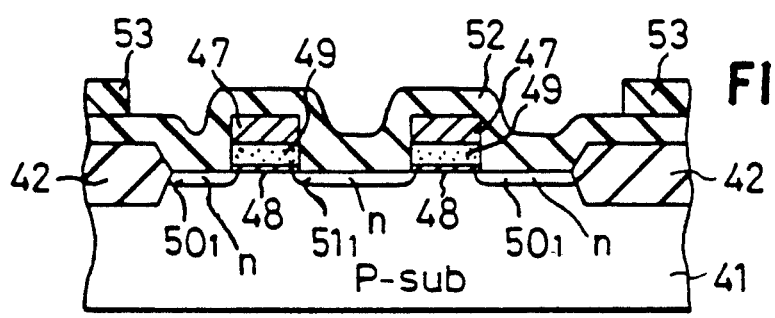
Figure 7D:
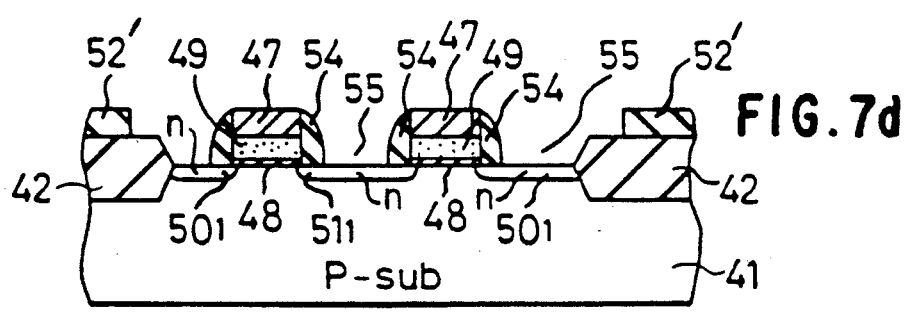

Next, as shown in FIG. 7(c), SiO$_2$ film 52 is deposited over the whole surface of substrate 41 by CVD method, then resist pattern 53 corresponding to field oxide layer 42 is formed by photolithography over SiO$_2$ film 52. In this case, it is desirable that, before deposition of SiO$_2$ film 52, thermal oxidation treatment be performed for 5 to 20 minutes at 900° to 1100° C. in an oxygen atmosphere to form an oxide film on the exposed peripheral sides of polycrystalline silicon gate electrodes 49. SiO$_2$ film 52 is deposited in a thickness in the range 2000 to 5000 Angstrom units, for example. It is desirable that there should be the following relationship between the thickness $t_1$ of SiO$_2$ film 52 and the thickness $t_2$ of SiO$_2$ film pattern 47:

$$t_2/A_2 > (1.5 \times t_1)/A_1$$

where $A_1$ is the rate at which SiO$_2$ film 52 is etched and $A_2$ is the rate at which SiO$_2$ film pattern 47 is etched. Next, as shown in FIG. 7(d), etching of the SiO$_2$ film 52 is performed utilizing the anisotropy of the RIE method to form a wall 54 consisting of SiO$_2$ on the side wall of gate electrodes 49 and SiO$_2$ film pattern 47 and gate oxide film 48 above and below them, and to form direct contact holes 55. SiO$_2$ film 52' is left behind on field oxide layer 42 in this step.

Figure 7E:
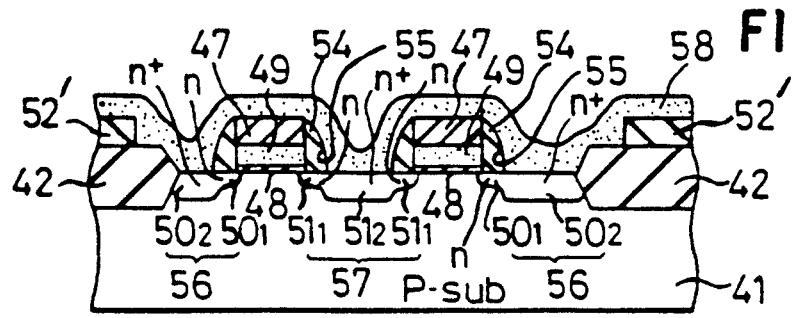
Figure 7F:
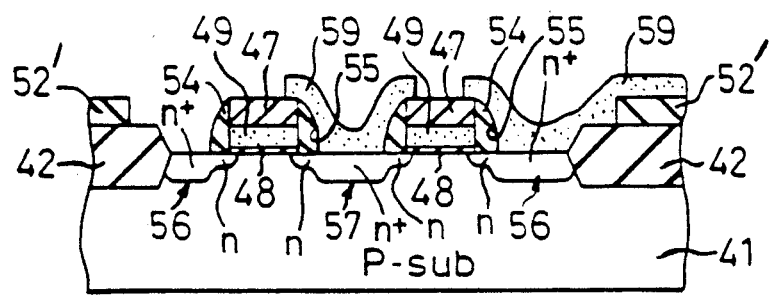

Next, as shown in FIG. 7(e), highly doped deep n+ type diffusion regions $50_2$ and $51_2$ are formed by ion implantation of an n type impurity, for example arsenic, into exposed n type diffusion regions $50_1$ and $51_1$ in a dose of $10^{13}$ to $10^{16}$ atoms cm$^{-2}$, using SiO$_2$ film pattern 47 (on top) and wall 54 as a mask. By this process, drain region 56 consisting of n type diffusion region $50_1$ and n+ type diffusion region $50_2$ and source region 57 consisting of n type diffusion region $51_1$ and n+ type diffusion region $51_2$ are respectively formed. By the formation of these n+ type diffusion regions $50_2$ and $51_2$, increase in resistance when the surfaces of the n type diffusion regions $50_1$ and $51_1$ are etched when the direct contact holes 55 are formed by the RIE can be prevented, and also good contact can be achieved with the electrode layer. Next, as shown in FIG. 7(e), second polycrystalline silicon layer 58 is deposited over the whole surface of substrate 41, an impurity is diffused into second polycrystalline silicon layer 58 by for example low-temperature phosphorus diffusion. After this, as shown in FIG. 7(f), manufacture of the n-channel MOSIC is completed by patterning second polycrystalline silicon layer 58, using as a mask a resist pattern (not shown) formed by photolithography, and forming electrode layer 59 consisting of polycrystalline silicon connected through direct contact holes 55 with drain and source regions 56 and 57.

Figure 8:
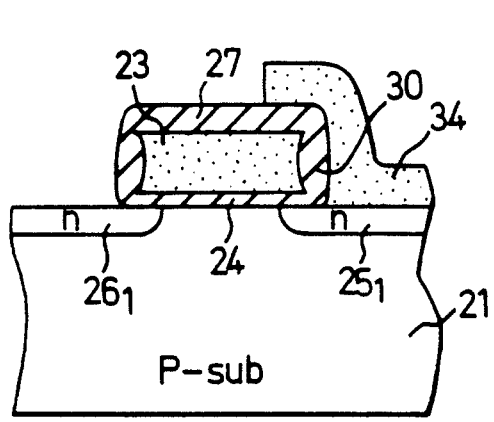
FIG. 8 is a partial cross-sectional view to a larger scale of a MOSIC manufactured by the method of FIG. 2.
Figure 9:
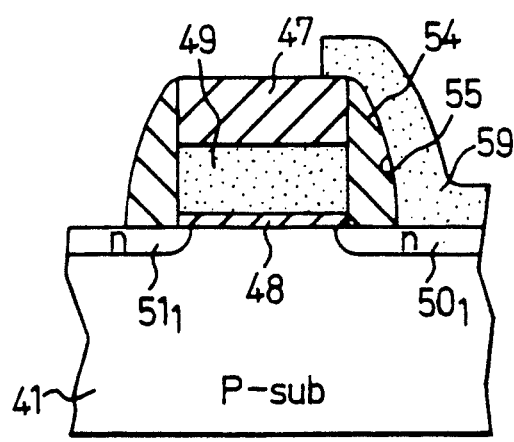
FIG. 9 is a partial cross-sectional view to a larger scale of a MOSIC manufactured by the first embodiment of this invention.
Figure 10:
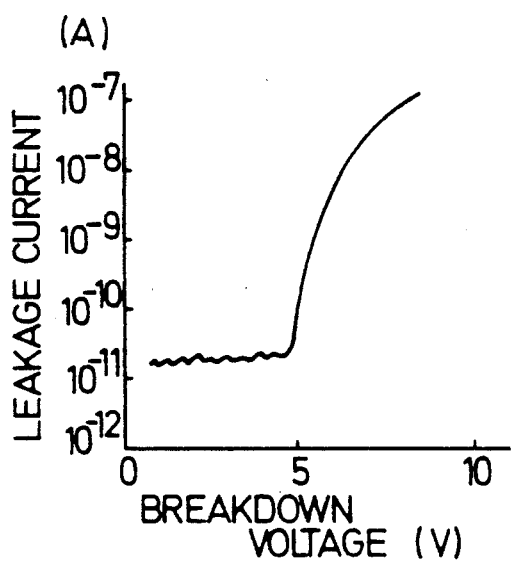
FIG. 10 is a view showing the characteristic of the gate breakdown voltage of the transistor of FIG. 8.
Figure 11:
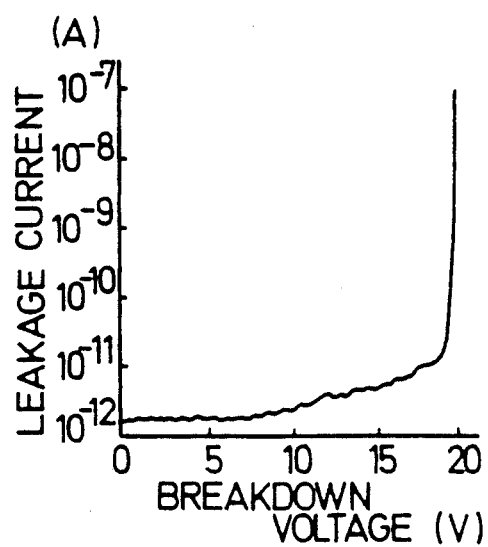
FIG. 11 is a view showing the characteristic of the gate breakdown voltage of the transistor of FIG. 9.

Thus, according to the method of this invention, after gate electrodes 49 are formed and SiO$_2$ film 52 is deposited over the entire surface, this SiO$_2$ film 52 is etched by the RIE method. In this way, direct contact holes 55 can be formed in a self-aligned manner with respect to gate electrodes 49 and field oxide layer 42 and walls 54 consisting of SiO$_2$ can be formed on the side faces of gate electrodes 49. As a result, a MOSIC can be obtained having MOS transistors of improved gate breakdown voltage. Measurements are made to compare the breakdown voltage between the electrode layer consisting of polycrystalline silicon and the gate electrodes of MOS transistors as shown in FIG. 9 fabricated according to this invention with that of MOS transistors made by the prior art method and shown in FIG. 8. The characteristic of the structure shown in FIG. 8 fabricated by the prior art method is shown in FIG. 10 and the characteristic of the MOS transistor shown in FIG. 9 fabricated by the method of this embodiment is shown in FIG. 11. As can be seen from FIG. 10 and FIG. 11, whereas with the prior art method of direct contact hole formation current leakage starts form 5 V, with this embodiment current leakage does not occur below 20 V i.e. the breakdown voltage is much higher.

Figure 12:
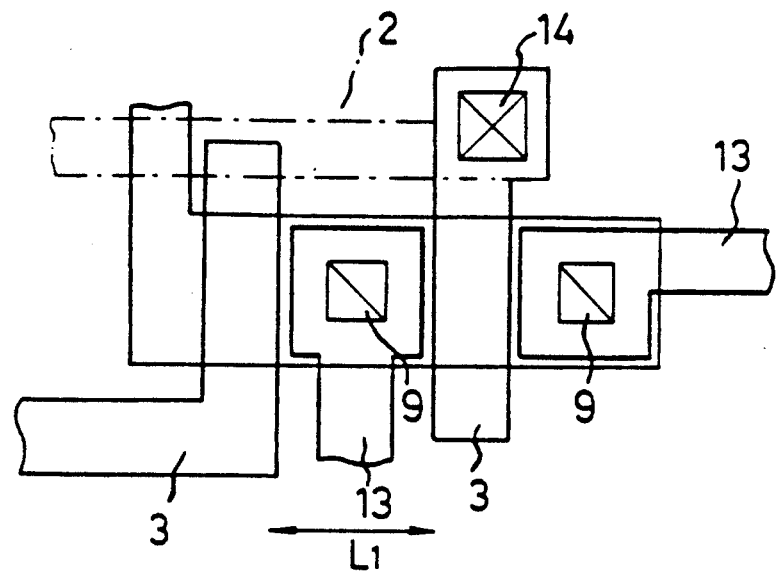
FIG. 12 is a plan view showing the pattern layout of a MOSIC manufactured by the method of FIG. 1.
Figure 13:
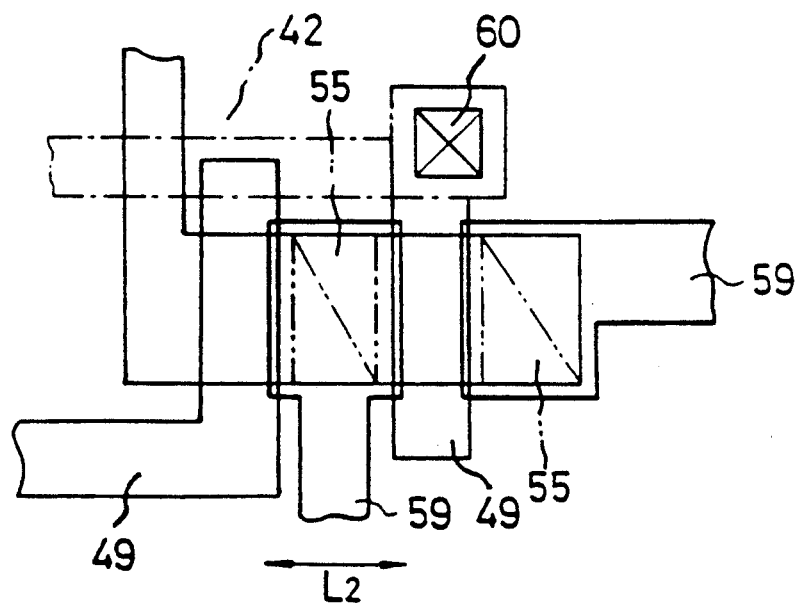
FIG. 13 is a plan view showing the pattern layout of a MOSIC manufactured by the first embodiment of this invention.

Furthermore, highly integrated MOSICs can be obtained, since, as mentioned above, direct contact holes 55 can be formed in a self-aligned manner with respect to gate electrodes 49. In fact, whereas with a MOSIC manufactured by the process of FIG. 1, as described above, gate electrodes 3 manufactured, as shown in the pattern layout of FIG. 12, with a width (rule) of 2 microns, require a separation L1 of at least 4 microns, with a MOSIC manufactured according to this embodiment, gate electrodes 49 manufactured with the same width (rule) of 2 microns can have a separation L2 of less than 2 microns as shown in the pattern layout of FIG. 13. Numeral 14 in FIG. 12 is a contact hole provided to connect the gate electrode 3 with the outside. Numeral 60 in FIG., 13 is a contact hole provided to connect the gate electrode 49 with the outside.

In the above embodiment polycrystalline silicon is used for the gate electrode. However, it may alternatively be formed of a metal silicide such as molybdenum silicide or tungsten silicide. And a metal silicide such as molybdenum silicide or tungsten silicide may be used instead of the second polycrystalline silicon layer.

The above embodiment is described for an example in which the invention is applied to manufacture of an n channel MOSIC. However, the invention can also be applied to the manufacture of p channel MOSICs or CMOSICs etc.

As described in detail above, this invention provides a method of manufacturing semiconductor devices such as MOSICs or LSIs of a high degree of integration with high reliability and in high yield.

Next the second embodiment of this invention is explained in detail below with reference to the manufacture, by means of the manufacturing process of FIG. 14(a) to (f) and FIG. 15, of a ROM memory cell with memory provided by n channel MOS transistors.

First of all, as shown in FIG. 14(a), selective oxidation is performed on for example p type silicon semiconductor substrate 131 to form field oxide film 132. Thermal oxidation is then carried out to form an oxide film. A phosphorus-containing polycrystalline silicon layer is then formed by for example CVD over the entire surface. The polycrystalline silicon layer may be initially formed without doping with impurity and phosphorus doping performed subsequently. After this, an oxide film of thickness of about 4000 Angstrom units is deposited over the whole face on top of the polycrystalline silicon layer by the CVD method or by thermal oxidation of the polycrystalline silicon layer. Polycrystalline silicon gate electrodes 135 with oxide films 133, 134 arranged above and below them are then formed by etching by the RIE method, using as a mask a resist pattern (not shown) formed by photolithography. Next, n type diffusion regions $136_1$ and $137_1$ are formed by ion implantation of n type impurities, for example phosphorus (or arsenic), using as a mask polycrystalline silicon gate electrodes 135 and oxide films 133 and 134 above and below them.

Next, as shown in FIG. 14(b), a $SiO_2$ film 138 of thickness about 5000 Angstrom units is formed over the whole surface of substrate 131 by the CVD method. After this, as shown in FIG. 14(c), etching is performed on the $SiO_2$ film 138 utilizing the anisotropy of the RIE method, to form wall 139 consisting of $SiO_2$ on the side walls of gate electrodes 135 and oxide films 133, 134 above and below them, and to form buried contact holes 140.

Figure 14E:
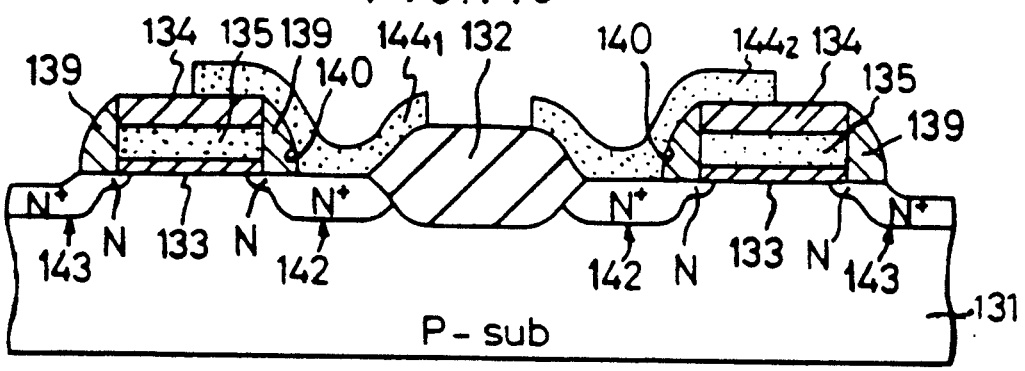
FIG. 14 (a) to (f) are cross-sectional views showing a process of manufacture for obtaining a ROM memory cell according to a second embodiment of this invention.

Next, as shown in FIG. 14(d), second polycrystalline silicon layer 141 is deposited over the whole surface of substrate 131 and n+ type diffusion regions $136_2$, $137_2$ more highly doped than diffusion regions $136_1$, $137_1$ are formed by diffusing phosphorus into diffusion regions $136_1$, $137_1$ of substrate 131, in contact through buried contact holes 140, while diffusing impurity into second polycrystalline silicon layer 141 by for example low temperature phosphorus diffusion. By this means, drain region 142 consisting of n type diffusion region $136_1$ and n+ type diffusion region $136_2$ and source region 143 consisting of n type diffusion region $137_1$ and n+ type diffusion region $137_2$ are respectively formed. After this, as shown in FIG. 14(e), connection is established through buried contact holes 140 with drains 142 of the MOS transistors by patterning second polycrystalline silicon layer 141 using as a mask a resist pattern (not shown) formed by photolithography, and polycrystalline silicon electrode layers (contact pad layers) $144_1$, $144_2$ of which at least part extends over oxide film 134 of gate electrodes 135 are formed.

Figure 14F:
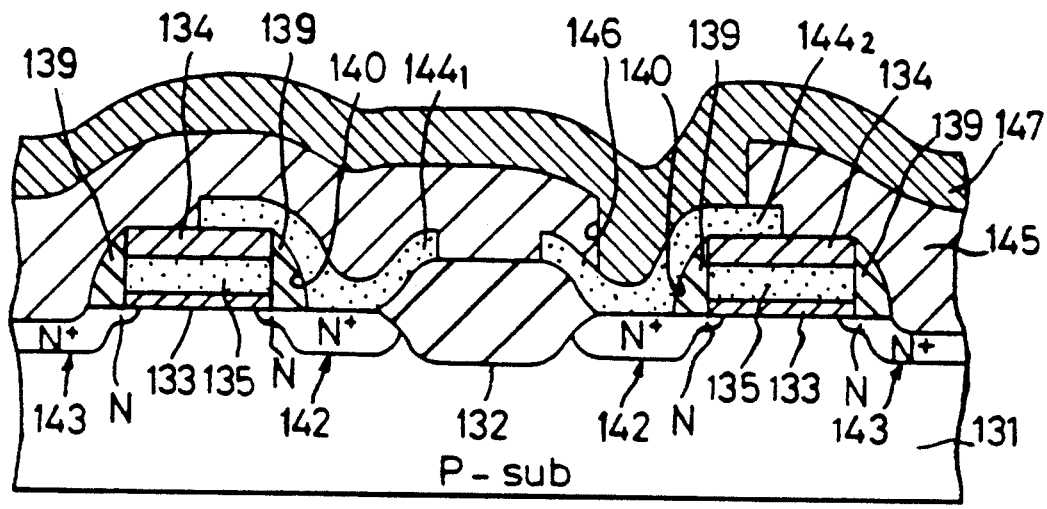
Figure 15:
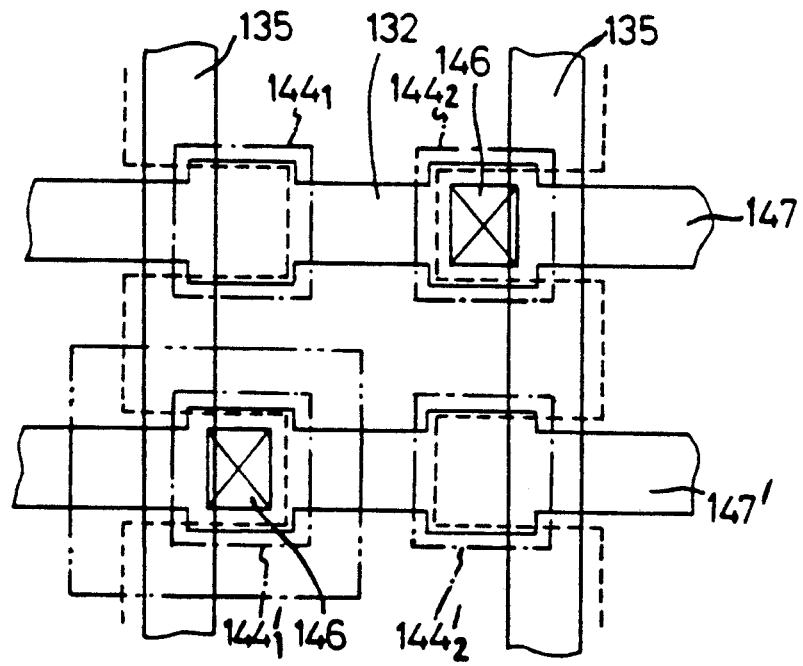
FIG. 15 is a plan view of the memory cell of FIG. 14 (f).

Next, as shown in FIG. 14(f), CVD-$SiO_2$ film 145 of thickness about 10,000 Angstrom units is deposited over the entire surface, and contact holes 146 corresponding to the ROM data (write date) are formed through the CVD-$SiO_2$ film 145 on the surface of one contact pad layer $144_2$, using as a mask a resist pattern (not shown) formed by photolithography. Aluminum is then deposited by the vacuum evaporation method, and data lines 147 are formed by patterning the aluminum layer. The device shown in FIG. 14(f) and FIG. 15 is then completed by forming a protective covering film (not shown) over the entire surface. FIG. 15 is a plan view of FIG. 14(f). The region enclosed by the double-dotted chain line is a single memory cell. In FIG. 14(f), the right side of the memory cell shows the case in which contact pad layer $144_2$ is connected to drain region 142 of the transistor through buried contact hole 140, and contact pad layer $144_2$ is connected to aluminum data line 147 through contact hole 146; the left side of the memory cell shows the case in which CVD-$SiO_2$ film 145 is left between contact pad layer $144_1$ and data line 147, so that drain region 142 of the transistor is not connected to data line 147.

Figure 1A:
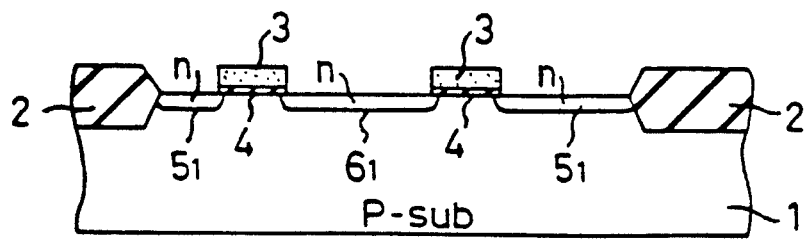
FIG. 1 (a) to (e) are cross-sectional views showing the process of manufacturing a prior art MOSIC.
Figure 1B:
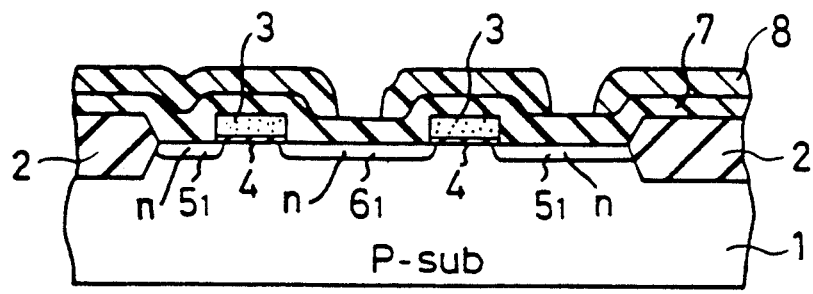
Figure 1C:
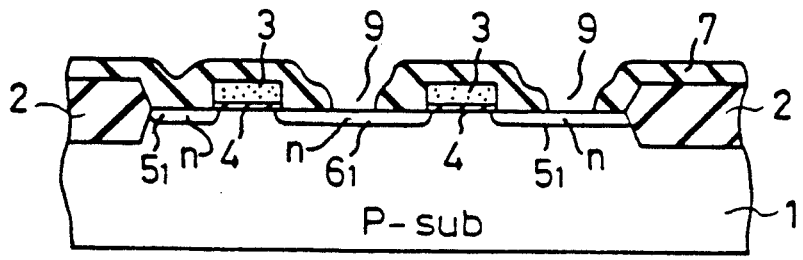
Figure 1D:
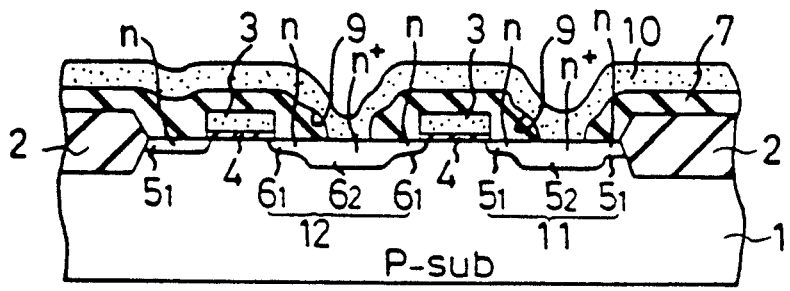
Figure 1E:
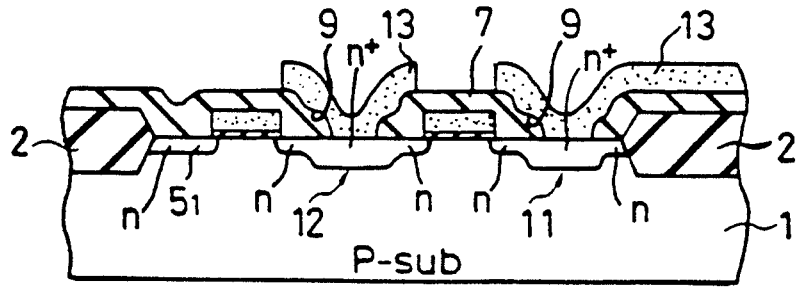
Figure 2A:
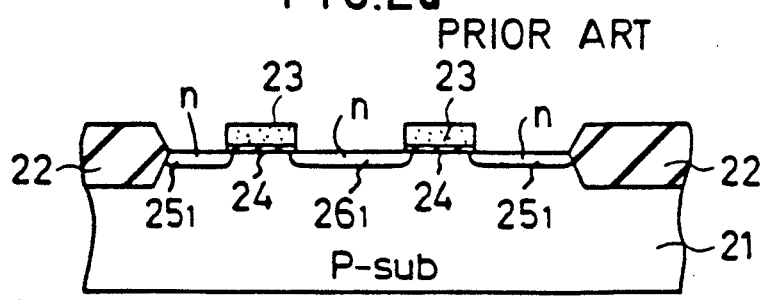
FIG. 2 (a) to (e) are cross-sectional views showing the process of manufacturing another prior art MOSIC.
Figure 2B:
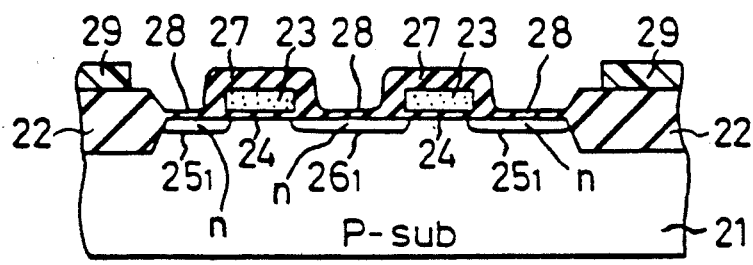
Figure 2C:
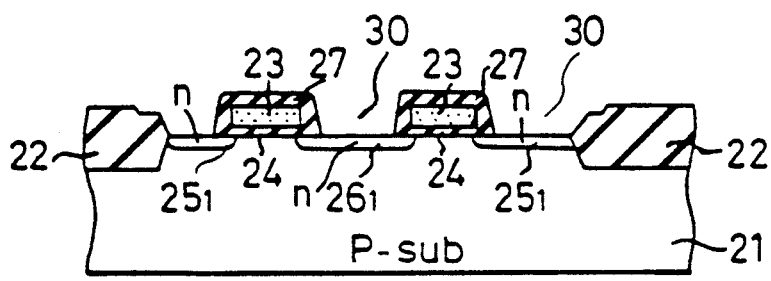
Figure 2D:
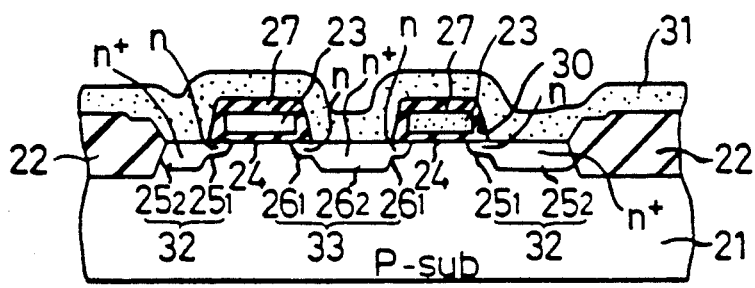
Figure 2E:
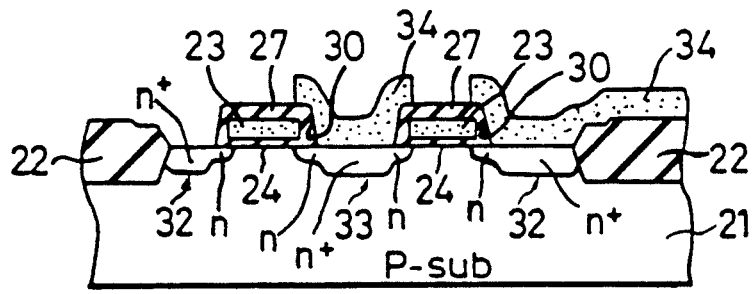
Figure 3:
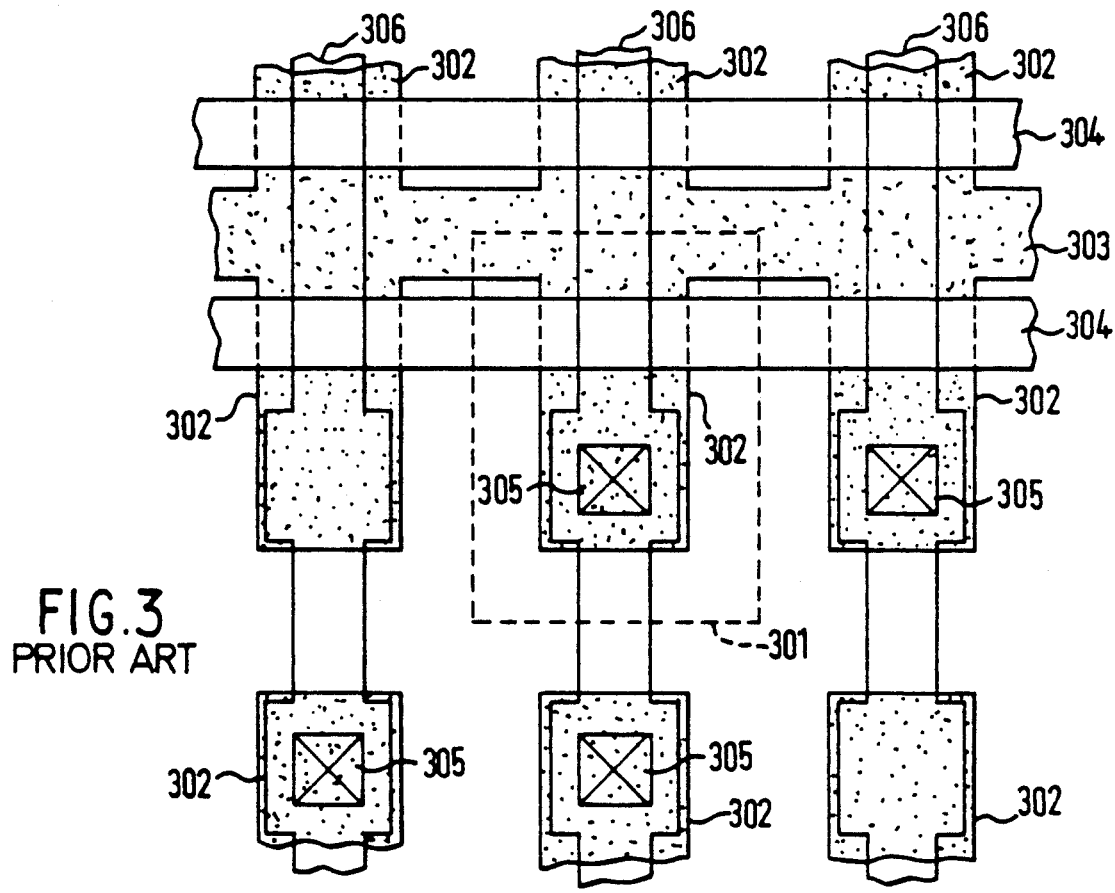
FIG. 3 is a plan view showing a prior art memory cell.
Figure 4:
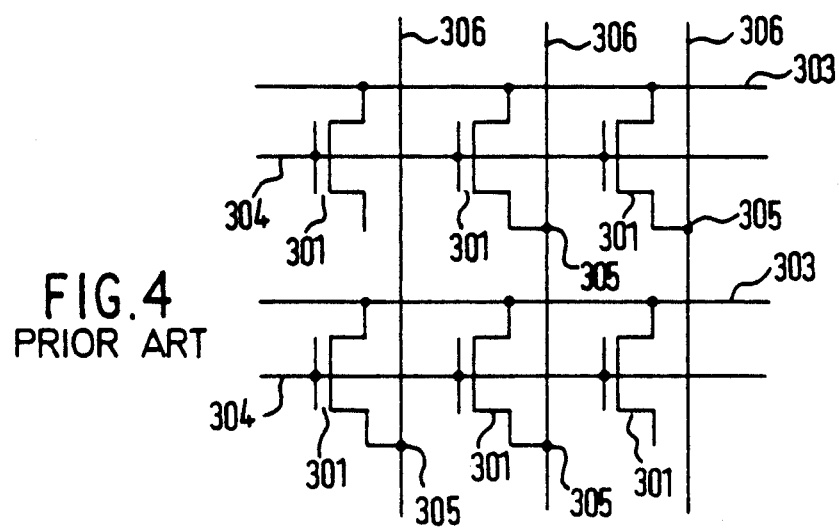
FIG. 4 is an equivalent circuit diagram of the memory cell of FIG. 3.
Figure 5:
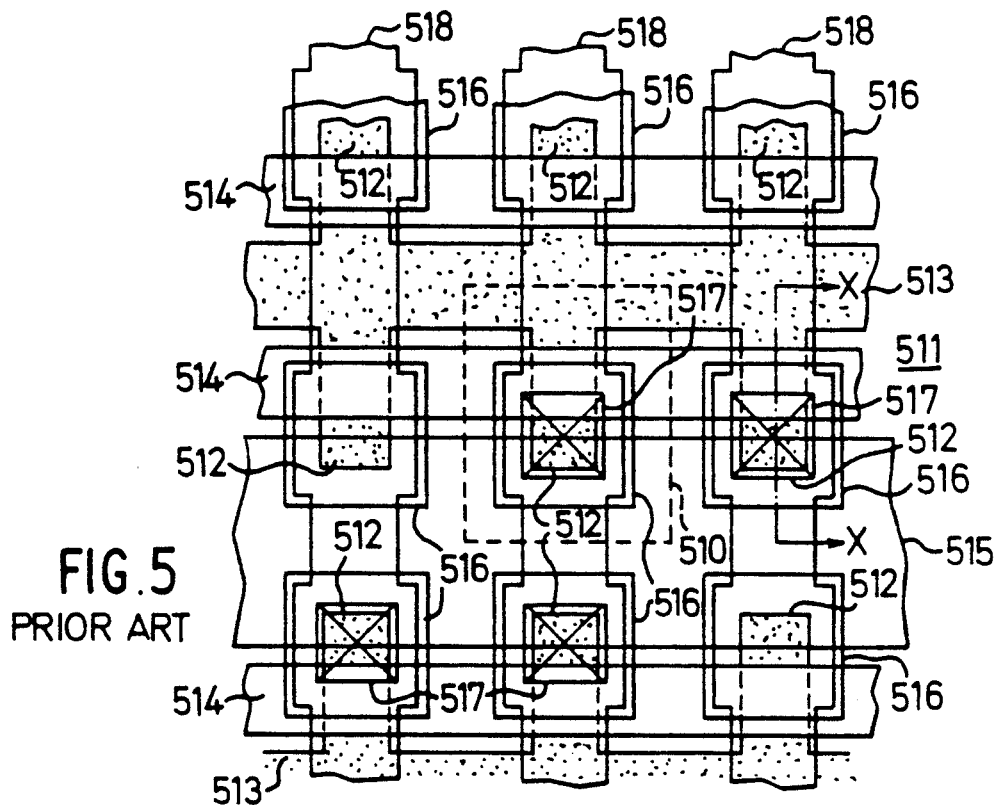
FIG. 5 is a plan view showing a ROM memory cell that has already been the subject of a patent application by the present inventors.
Figure 6:
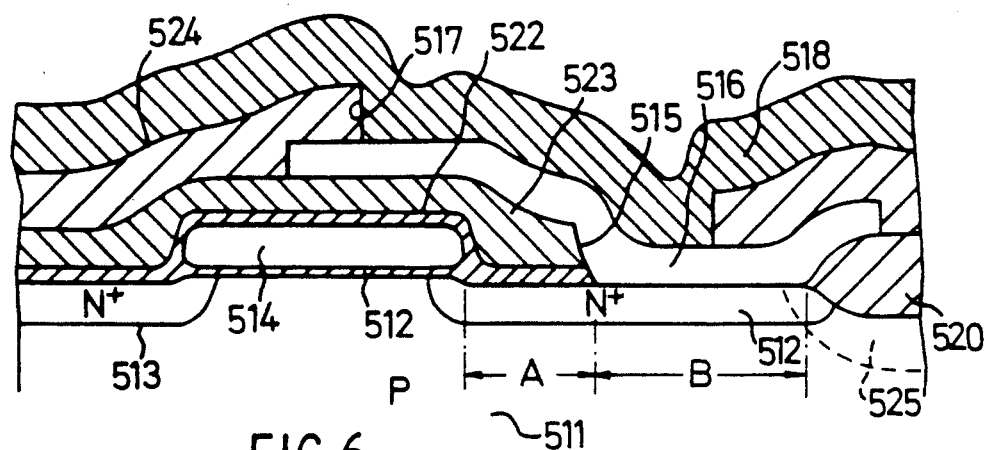
FIG. 6 is a cross-sectional view along the line X-X in FIG. 5.

Thus, as shown in FIG. 14(f) and FIG. 15, by means of this invention, buried contact holes 140 are formed in a self-aligned manner with respect to gate electrodes 135, with the result that the need for the distance shown by A in FIG. 6 (given in explanation of the prior art technique), which is required to compensate for mask alignment errors produced in the photolithographic process, is practically eliminated. An allowance (B in FIG. 6) in the width of the buried contacts to include a distance to compensate for mask alignment errors with respect to the element-isolating field oxide film layer 132 is likewise no longer required. The result of all this is that it is possible to reduce the area of the memory cell to one half of that of a similar conventional memory cell. Consequently, the memory cell size in the direction of the data line of the cell can be correspondingly reduced, making it possible to manufacture by a simple method a ROM of the same standard design as previously but with considerably increased intergration density The reliability of the device can also be improved.

Furthermore, since the drain and source regions 142 and 143 are formed by a double diffusion process which makes them self-aligned with respect to each other, they form regions having a smooth curve. In consequence, a memory cell can be obtained that has a high MOS transistor breakdown voltage and low resistance diffusion layer gradient.

The third embodiment of this invention will now be described with reference to the manufacturing process illustrated in detail in FIG. 16(a) to (e).

Figure 16A:
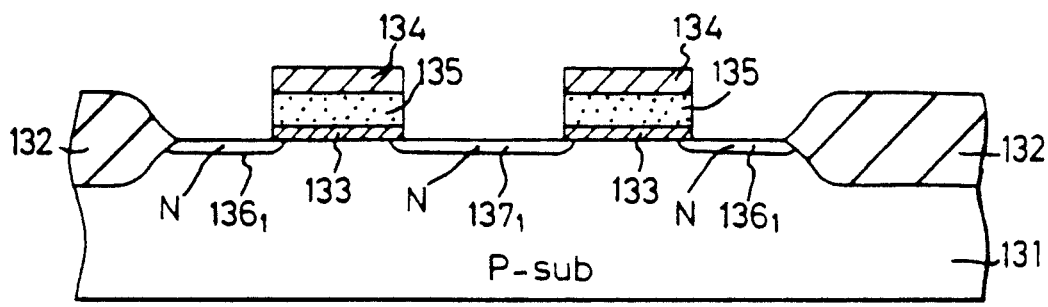
FIG. 16 (a) to (e) are cross-sectional views showing a process of manufacture for obtaining a ROM memory cell according to a third embodiment of this invention.

First of all, as shown in FIG. 16(a), selective oxidation is performed on for example a p type silicon semiconductor substrate 131 to form field oxide film 132. Thermal oxidation is then carried out to form an oxide film. A phosphorus-containing polycrystalline silicon layer is then formed by for example the CVD method over the entire surface. After this, an oxide film of thickness about 4000 Angstrom units is deposited over the whole face on top of the polycrystalline silicon layer by the CVD method or by thermal oxidation of the polycrystalline silicon layer. Polycrystalline silicon gate electrodes 135 with oxide films 133, 134 arranged above and below them are then formed by etching by the RIE method, using as a mask a resist pattern (not shown) formed by photolithography. Next, n type diffusion regions $136_1$ and $137_1$ are formed by ion implantation of n type impurities, for example phosphorus (or arsenic), using as a mask polycrystalline silicon gate electrodes 135 and oxide films 133 and 134 above and below them.

Figure 16B:
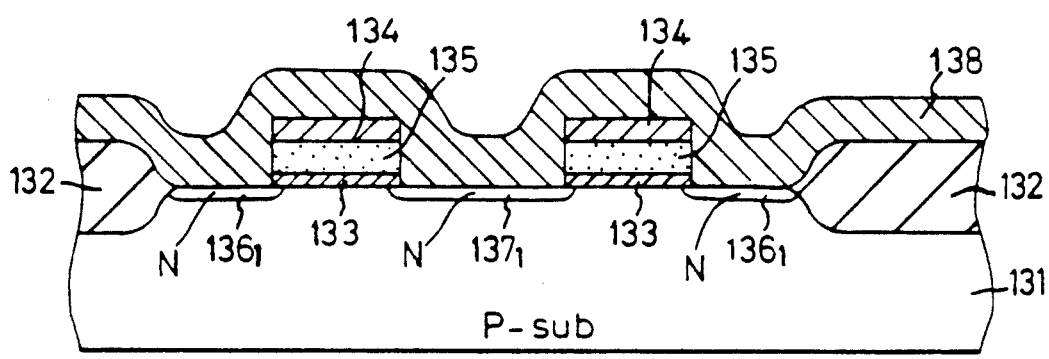
Figure 16C:
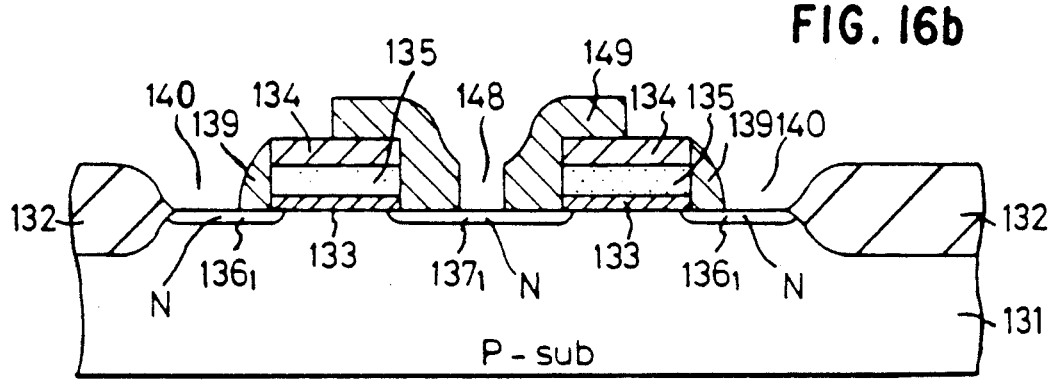

Next, as shown in FIG. 16(b), a $SiO_2$ film 138 of thickness about 5000 Angstrom units is formed over the whole surface of substrate 131 by the CVD method. After this, the source regions are formed, in self-alignment with the MOS transistor drain regions, by etching the $SiO_2$ film 138 utilizing the anisotropy of RIE, using as a mask a resist pattern (not shown) formed by photolithography carried out on only those regions where the metallic wiring layer and the contact holes of the diffusion region are to be formed in the subsequent step, to form wall 139 consisting of $SiO_2$ on the side walls of gate electrodes 135 and oxide films 133, 134 above and below them, and to form buried contact holes 140. At the same time, as shown in FIG. 16(c), SiO$_2$ film pattern 149 is formed with buried contact holes 148 at locations corresponding to the n type diffusion region 137$_1$ and extending over the oxide film 134 of the two gate electrodes 135.

Figure 16D:
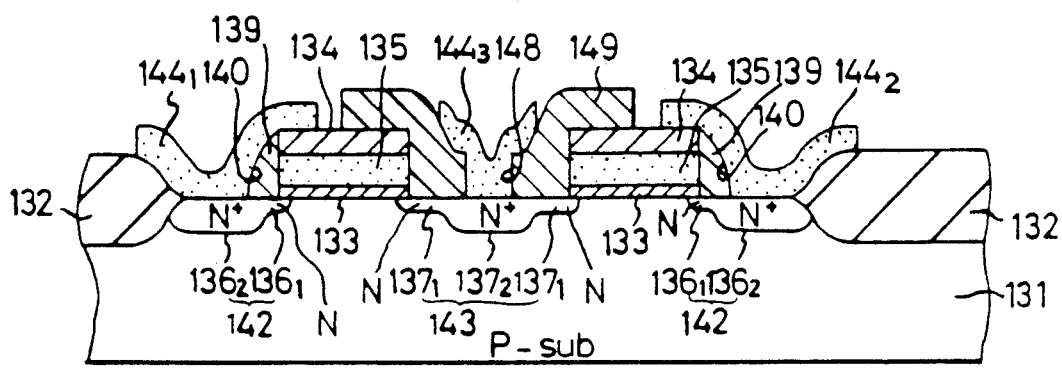

Next, as shown in FIG. 16(d), a second polycrystalline silicon layer is deposited over the whole surface of substrate 131 and n+ type diffusion regions 136$_2$, 137$_2$ more highly doped than diffusion regions 136$_1$, 137$_1$ are formed by diffusing phosphorus into diffusion regions 136$_1$, 137$_1$ of substrate 131, in contact through buried contact holes 140, 148 while diffusing impurity into second polycrystalline silicon layer by for example low temperature phosphorus diffusion. By this means, drain region 142 consisting of n type diffusion region 136$_1$ and n+ type diffusion region 136$_2$ and source region 143 consisting of n type diffusion region 137$_1$ and n+ type diffusion region 137$_2$ are respectively formed. After this, as shown in FIG. 16(d), connection is established through buried contact holes 140 with drains 142 of the MOS transistors by patterning second polycrystalline silicon layer using as a mask a resist pattern (not shown) formed by photolithography, and polycrystalline silicon electrode layers (contact pad layers) 144$_1$, 144$_2$ of which at least part extends over oxide film 134 of gate electrodes 135, and also an electrode layer 144$_3$, consisting of polycrystalline silicon connected to source region 143 through contact hole 148 are formed.

Figure 16E:
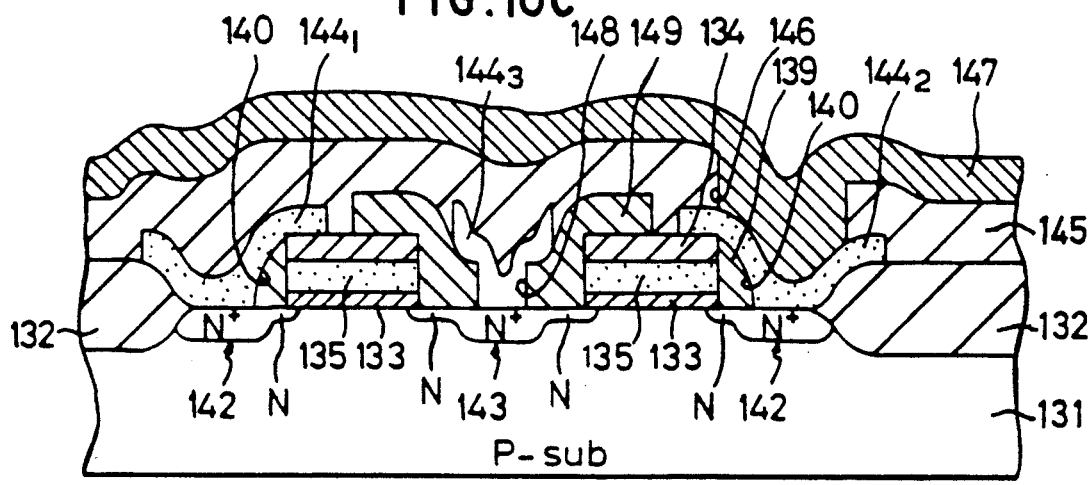

Next, as shown in FIG. 16(e), CVD-SiO$_2$ film 145 of thickness about 10,000 Angstrom units is deposited over the entire surface, and contact holes 146 corresponding to the ROM data (write data) are formed through the CVD-SiO$_2$ film 145 on the surface of one contact pad layer 144$_2$, using as a mask a resist pattern (not shown) formed by photolithography. An aluminum layer is then deposited by the vacuum evaporation method, and data lines 147 are formed by patterning the aluminum layer. The device is then completed by forming a protective covering film (not shown) over the entire surface. The right side of the memory cell shows the case in which contact pad layer 144$_2$ is connected to drain region 142 of the transistor through buried contact film 145 is left between contact pad layer 144$_1$ and data hole 140, and contact pad layer 144$_2$ is connected to aluminum data line 147 through contact hole 146; the left side of the memory cell shows the case in which CVD-SiO$_2$ line 147, so that drain region 142 of the transistor is not connected to data line 147. Although not shown in the drawings, contact holes are formed in contact pad layer 144$_3$ in the same step as contact holes 146, and aluminum wiring separate from data line 147 is connected with source region 143.

With a structure as described above, CVD-SiO$_2$ film pattern 149 is provided having buried contact holes 148 at locations corresponding to source regions 143, contact pads 144$_1$ and 144$_2$ are formed by patterning a polycrystalline silicon layer so that they are connected through buried contact holes 140 with drain regions 142, and an electrode layer 144$_3$ consisting of polycrystalline silicon is formed connected through buried contact holes 148 with source region 143. Thus by this means it is possible to prevent etching of the surface of source region 143 exposed as in the second embodiment described above, and electrode layer 144$_3$ can be utilized as an external lead-out electrode of source region 143.

Figure 17:
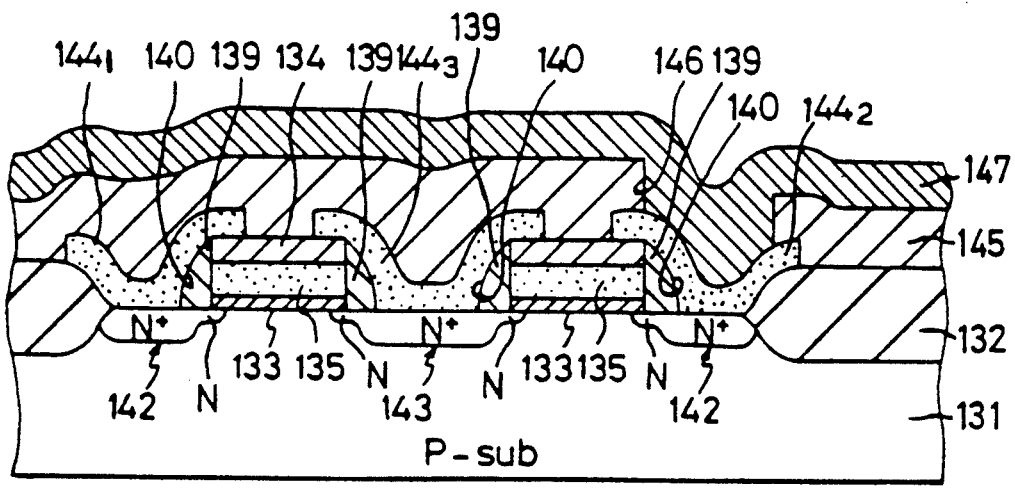
FIG. 17 is a cross-sectional view of a fourth embodiment of this invention.

Also, as shown in FIG. 17, a construction can be adopted in which wall 139 consisting of insulating material is formed on both side faces of gate electrode 135 and upper and lower oxide films 133 and 134, and electrode layers 144$_1$ to 144$_3$ are formed, which consist of polycrystalline silicon and which are connected through buried contact holes 140 with drain and source regions 142, 143, by forming buried contact holes 140, depositing a layer of polycryatalline silicon, diffusing for example phosphorus, and patterning this layer of polycrystalline silicon.

This invention is not restricted to the above embodiment but can be modified in various ways. For example, the above embodiment is described for the case where the contact pad layer and word line, constituting the common gate electrode of the MOS transistors that form the memory are made of polycrystalline silicon. However, apart from this, high melting point metal silicides such as molybdenum silicide or high melting point metal or a two-layer construction of high melting point metal and polycrystalline silicon can be used. The important point is that this layer should be made of an electrically conductive material capable of containing impurity.

In the above-described embodiment, an n-channel ROM is used employing a p type substrate. However, this invention can of course be applied to a ROM of n-well CMOS structure using a p type semiconductor substrate or to a ROM of CMOS structure wherein p-well regions are formed in an n-type semiconductor substrate.

As described in detail above, by means of this invention, a polycrystalline silicon electrode layer constituting a contact pad for a metal wiring layer forming a data line can form buried contacts in a self-aligned configuration and a read-only semiconductor device can be provided that is capable of being constructed with much increased integration density.

What is claimed is:

1. A method of manufacturing a semiconductor device comprising the steps of:
   forming a gate electrode having upper and lower insulating films arranged above and below said gate electrode, on the surface of a semiconductor substrate of a first conductivity type;
   forming a pair of diffusion regions of second conductivity type using said gate electrode and its upper and lower insulating films as a mask;
   depositing a first insulating layer over the entire surface including said upper insulating film;
   forming walls on the both side faces of said gate electrode and its upper and lower insulating films by anisotropic etching of said first insulating layer so as to expose the surface of the semiconductor substrate and simultaneously forming direct contact holes exposing the surface of said substrate;
   depositing a conductive layer over the entire surface of said semiconductor substrate so as to directly contact said walls and then forming electrode layers connected to said diffusion regions through said direct contact holes by patterning said conductive layer;
   forming a second insulation layer over the entire surface of said semiconductor substrate;
   opening at least one contact hole in said insulation layer; and
   selectively forming a wiring layer connected to one of said electrode layers through said contact hole;

wherein said upper insulating film arranged over said gate electrode is formed thicker than said first insulating layer and is formed to satisfy the relationship below:

t2/A2 > 1.5 .t1/A1 wherein
t1: the thickness of said first insulating layer
t2: the thickness of said upper insulating film,
A1: etching rate of said first insulating layer at the anisotropic etching,
A2: etching rate of said upper insulating film at the anisotropic etching.

* * * * *